United States Patent
Hilburn et al.

(10) Patent No.: US 7,762,411 B2
(45) Date of Patent: Jul. 27, 2010

(54) TOOL-LESS RACK RAIL SYSTEM INCORPORATING CLAMPING MECHANISM

(75) Inventors: John Charles Hilburn, Austin, TX (US); Stephen Peter Mroz, Rochester, MN (US); Joseph Daniel Rico, Rochester, MN (US); Jeffrey Alan Verkerke, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 11/873,482

(22) Filed: Oct. 17, 2007

(65) Prior Publication Data

US 2009/0101603 A1 Apr. 23, 2009

(51) Int. Cl.
*A47B 47/00* (2006.01)
(52) U.S. Cl. .................................................. 211/192
(58) Field of Classification Search ................ 211/192, 211/189, 186; 52/36.5, 36.6; 248/220.21, 248/220.22, 222.14, 222.52
See application file for complete search history.

(56) References Cited

U.S. PATENT DOCUMENTS

| | | | | |
|---|---|---|---|---|
| 3,291,194 A | * | 12/1966 | Kirtley et al. | 160/181 |
| 3,601,432 A | * | 8/1971 | Fenwick et al. | 403/230 |
| 3,950,054 A | * | 4/1976 | Ward et al. | 439/135 |
| 4,048,768 A | * | 9/1977 | Good | 52/36.6 |
| 4,295,234 A | * | 10/1981 | Whitehead | 5/184 |
| 4,671,481 A | * | 6/1987 | Beard | 248/222.13 |
| 4,971,281 A | * | 11/1990 | Steinbeck | 248/222.13 |
| 5,063,715 A | * | 11/1991 | Goodman | 52/36.6 |
| 5,134,826 A | * | 8/1992 | La Roche et al. | 52/584.1 |
| 5,899,035 A | * | 5/1999 | Waalkes et al. | 52/239 |
| 6,079,173 A | * | 6/2000 | Waalkes et al. | 52/239 |
| 6,098,358 A | * | 8/2000 | Waalkes et al. | 52/239 |
| 6,202,965 B1 | * | 3/2001 | Chong | 248/220.43 |
| 6,230,903 B1 | | 5/2001 | Abbott | |
| 6,301,846 B1 | * | 10/2001 | Waalkes et al. | 52/239 |
| 6,422,399 B1 | | 7/2002 | Castillo et al. | |
| 6,546,684 B2 | * | 4/2003 | Waalkes et al. | 52/239 |
| 6,622,873 B2 | | 9/2003 | Hegrenes et al. | |
| 6,691,963 B1 | * | 2/2004 | Padiak et al. | 248/220.22 |
| 6,840,388 B2 | | 1/2005 | Mayer | |
| 7,036,187 B2 | * | 5/2006 | Rude | 16/342 |
| 7,357,362 B2 | * | 4/2008 | Yang et al. | 248/221.11 |

* cited by examiner

*Primary Examiner*—Sarah Purol
(74) *Attorney, Agent, or Firm*—Robert H. Berdo, Jr.

(57) ABSTRACT

A rack rail system engageable with a post of a rack. The rack rail system includes a rail assembly and a flange provided on at least an end of the rail assembly. The flange includes a pin insertable into an aperture of the post when the flange is adjacent to the post. The rack rail system further includes a clamp pivotably connected to the flange and movable from an open position and a closed position. The clamp receives both the post and the flange in the closed position.

18 Claims, 8 Drawing Sheets

TOOL-LESS RACK RAIL SYSTEM INCORPORATING CLAMPING MECHANISM

BACKGROUND OF THE INVENTION

1. Field of the Invention

The invention relates to a tool-less rack rail system for supporting electronic equipment, and in particular, to a tool-less rack rail system incorporating a clamping mechanism that maximizes the allowable width of the electronic equipment.

2. Background Information

Normally, sites may require multiple pieces of electronic equipment. For example, the electronic equipment may include computers and data storage equipment, such as servers and the like. In order to efficiently utilize all available space, the multiple electronic equipment may be accommodated in a rack which extends vertically, so that the space can be effectively utilized in the vertical direction. For example, a single rack may accommodate several servers.

Each piece of electronic equipment normally comprises an outer, aesthetically pleasing housing which is supported by the rack. The rack usually comprises a substantially rectilinear metal frame, including several vertical columns or posts, each provided with a plurality of openings or apertures which permit the mounting of various fastening hardware in the rack which couples the electronic equipment pieces to the rack. Pairs of rack rails are mounted to the generally vertical posts of the rack, so as to collectively support the individual electronic equipment pieces. Alternatively, a shelf, a drawer, or other system may be connected to the rack rails, so as to slidably support or accommodate the electronic equipment. Normally the rack rails are screwed or bolted to the vertical posts, using, for example, a conventional nut retainer clip. The conventional nut retainer clip is configured to wrap around the post of the rack, and retains a nut therein to be coupled with a threaded fastener, so as to fix the rack rails to the post of the rack. The electronic equipment, the shelf, or the drawer is then coupled or slidably connected to the rack rails.

For example, the rack commonly includes four spaced vertical posts including a pair of front posts and a pair of rear posts. Each of the front posts is aligned with the rear posts. The electronic equipment is mounted in the rack by a pair of rail assemblies. One rail assembly is mounted between one front post and an opposite rear post so as to support one side of the electronic equipment, and the other rail assembly is mounted between the other front post and the other opposite rear post so as to support another side of the electronic equipment.

In order to facilitate mounting of the rail assemblies to the vertical posts, there have been provided tool-less rack rail systems that can be mounted to the posts without having to use tools. Conventional tool-less rack rail systems either wrap around the posts, or have pins which protrude through the openings in the post and attach to an outer surface of the post by using other fastening elements.

FIG. 7 illustrates a perspective view of conventional rack rail systems 300 and 400 engaged with a rack that includes four posts, i.e., two front posts 510 and 520 and two rear posts 530 and 540. The rack rail system 300 is engaged with the front post 510 and the rear post 530, and the other rack rail system 400 is engaged with the front post 520 and the rear post 540. The two rack rail systems 300 and 400 collectively support the electronic equipment 600 thereon.

As shown in FIG. 8, the rack rail system 300 includes a flange 310 that wraps around the post 510. A pin 312 is inserted into a hole 512 of the post 510, in a direction from the inside of post 510 toward the outside of the flange. Accordingly, the pin 312 is further inserted into a corresponding, aligned hole 314 of the flange 310, and protrudes beyond it so as to secure the rack rail system 300 to the post 510. However, the pin 312 substantially protrudes beyond the hole 314 of the flange 310, and thus requires an extra accommodating space adjacent to an outer surface of the post 312. The protruding pin 312 thus requires a customized arrangement. This is because any covering member that covers the outer surface of the post 312 should be configured to prevent interference with the protruding pin 312.

Furthermore, the flange 310 wrapping around the post 510 has a substantial thickness, and interferes with a space between the post 510 and the other front post 520. Thus, a flange of the other rack rail system 400 also interferes with the space between the posts 510 and 520. Preferably, the flange of the other rack rail system 400 has the same thickness as the flange 310. Thus, when the flange 310 has a thickness of T, as shown in FIG. 8, and when the distance between of the two front posts 510 and 520 is D, as shown in FIG. 7, the maximum allowable width of the electronic equipment between the two posts 510 and 520 is a value obtained by subtracting 2 T from D. In the electronic equipment industry, there is a strong need to maximize available space between the posts, thereby maximizing the allowable width of any system to be accommodated in the space between the posts. However, in the conventional tool-less rack rail system, the substantial thickness of the flange interferes with the space between the posts, and therefore makes it difficult to utilize the space efficiently.

SUMMARY OF THE INVENTION

According to one aspect of the invention, a tool-less rack rail system that incorporates a clamping mechanism is provided and engaged with a post of a rack system. The tool-less rack rail system includes a rail assembly, a flange extending from an end of the rail assembly, and a clamp pivotably connected to the flange. The flange includes one or more pins that are inserted in respective apertures formed on the post. An aperture is formed on the flange to pivotably connect the clamp to the flange. The clamp may include a front portion, a rear portion and a middle portion connecting the front and rear portions together. Although other arrangements of the rack rail system are within the scope of the present invention, this particular configuration advantageously allows the clamp to be closed by a user to engage the rack rail system with the post of the rack system.

In another exemplary aspect of the invention, each of the flange, the front, and the rear portion of the clamp includes one or more extra apertures that correspond to each other. These apertures further correspond to the aperture of the post disposed between the clamp and the flange when the clamp is closed. Additional fastening elements are inserted into a through opening formed by the apertures, for a further securing of the flange to the post.

In a further exemplary aspect of the invention, the rear portion of the clamp includes a dimple protruding toward the front portion, and the flange includes an opening that accommodates the dimple when the clamp is closed, so as to maintain the clamp in a closed position. When the clamp is closed, the front portion of the clamp covers an outer surface of the post, and the rear portion of the clamp covers an inner surface of the flange. The clamp holds both the flange and post tightly, so as to connect the flange tightly to the post.

In a further exemplary aspect of the invention, the clamp includes a finger bent outwardly to facilitate the gripping of the clamp when the clamp needs to be detached from the flange.

The middle portion of the clamp covers an edge of the post, and interferes with a space between which the electronic equipment or any other system can be accommodated. Preferably, the thickness of the clamp is smaller than a thickness of the flange, so as to minimize interferences on the edge of the post, as opposed to the conventional rack rail system wrapping the post with its flange. When the clamp is made of a sheet metal, it gives several extra millimeters of allowable width to the rack rail system.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper", "lower", "front", "back", "over", "under", and similar such terms are not to be construed as limiting the invention to a particular orientation. Instead, these terms are used only on a relative basis.

Figure 1:
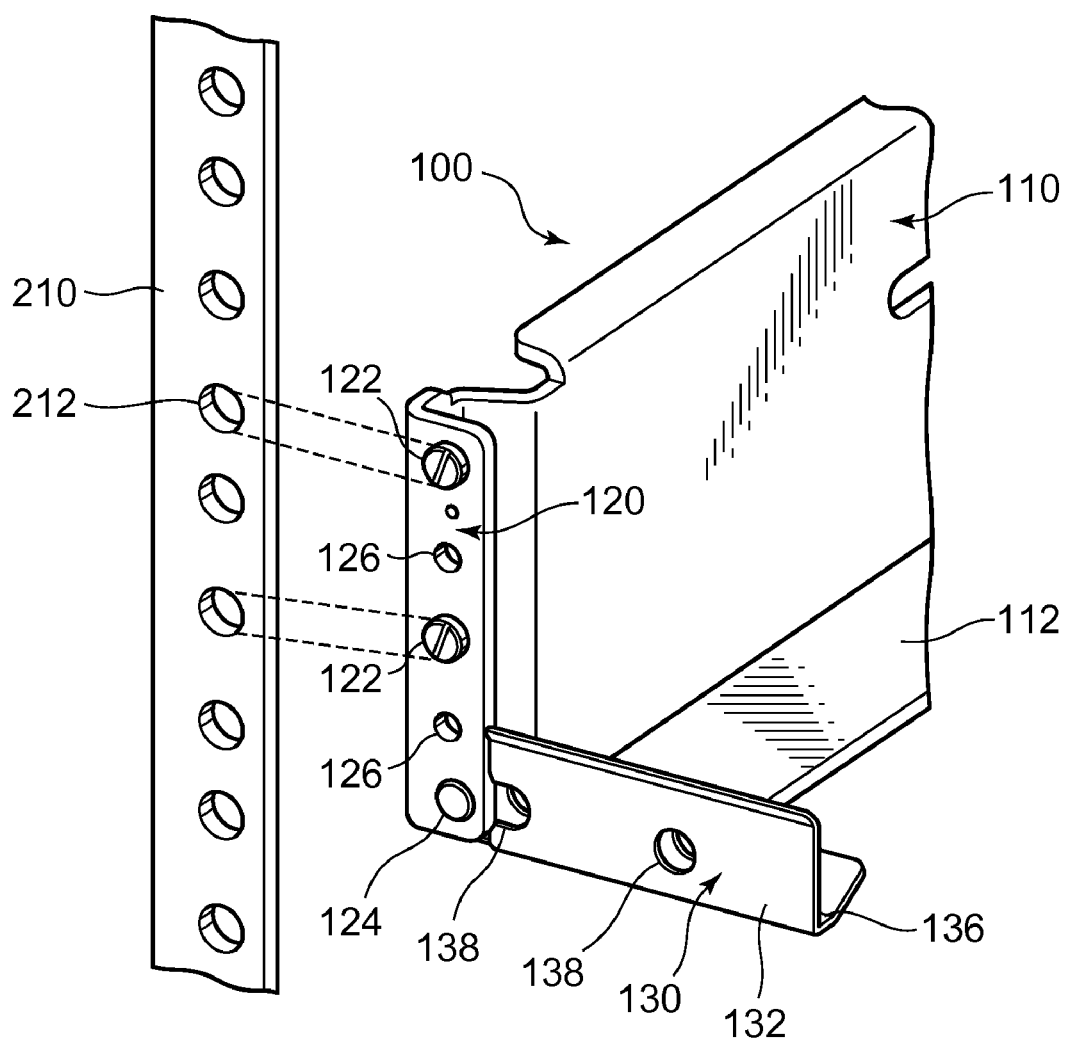
FIG. 1 is a perspective partial view of a tool-less rack rail system incorporating a clamp, according to an exemplary embodiment of the present invention.
Figure 6:
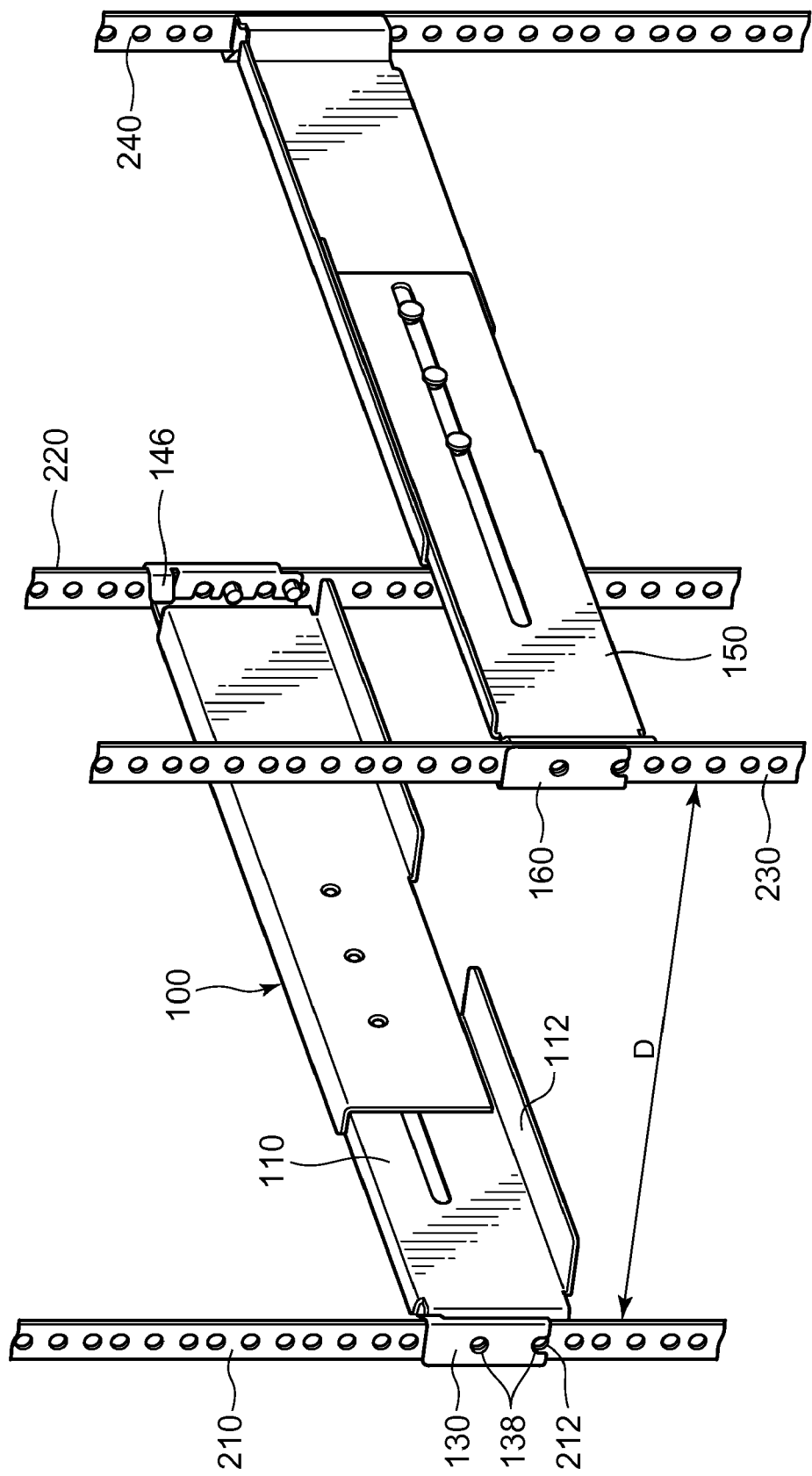
FIG. 6 is a perspective view of the rack rail system shown in FIG. 5, illustrating the attachment of both ends of the rack rail system to spaced two posts.
Figure 7:
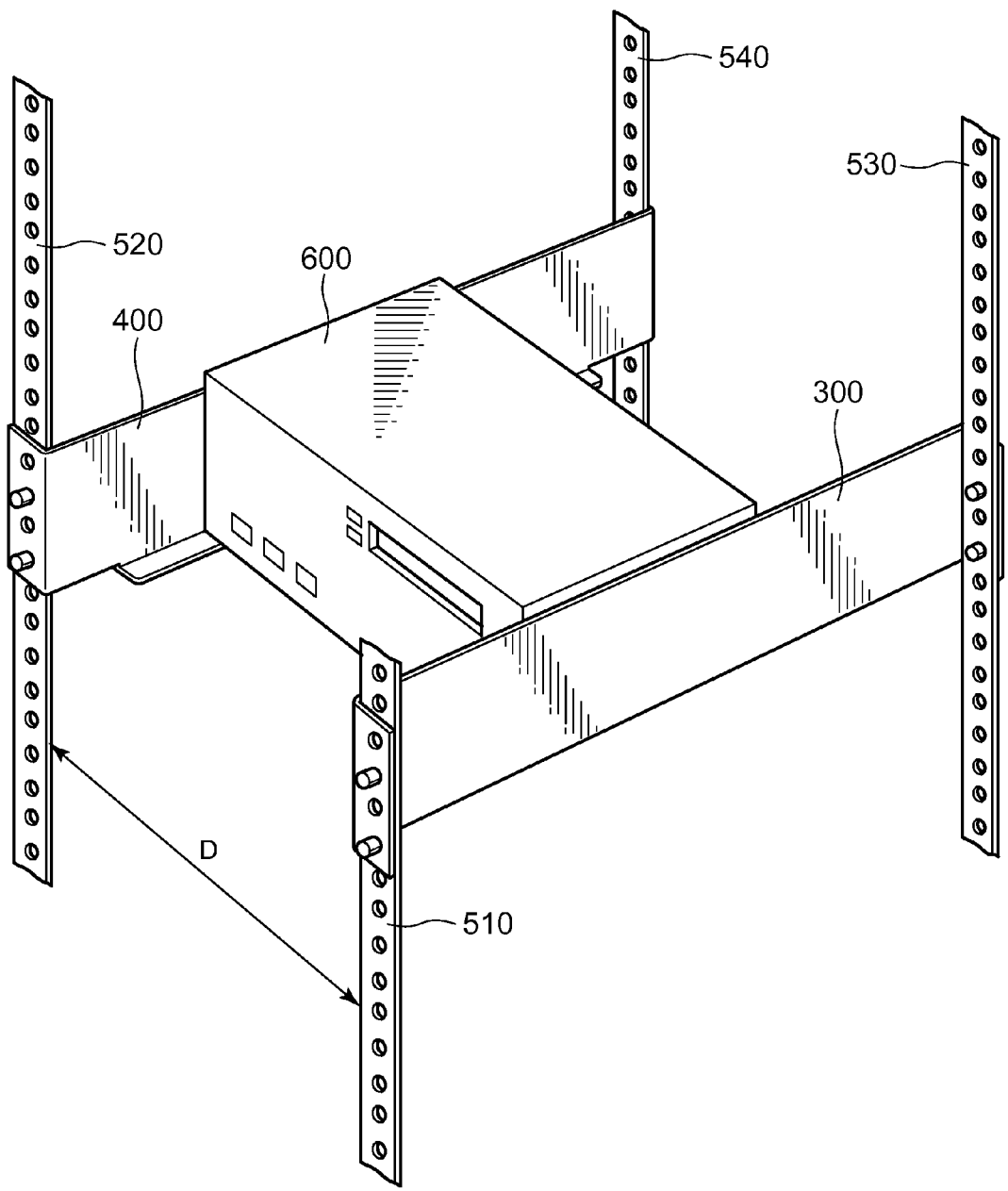
FIG. 7 is a perspective view of conventional tool-less rack rail systems that support electronic equipment and are attached to a rack.
Figure 8:
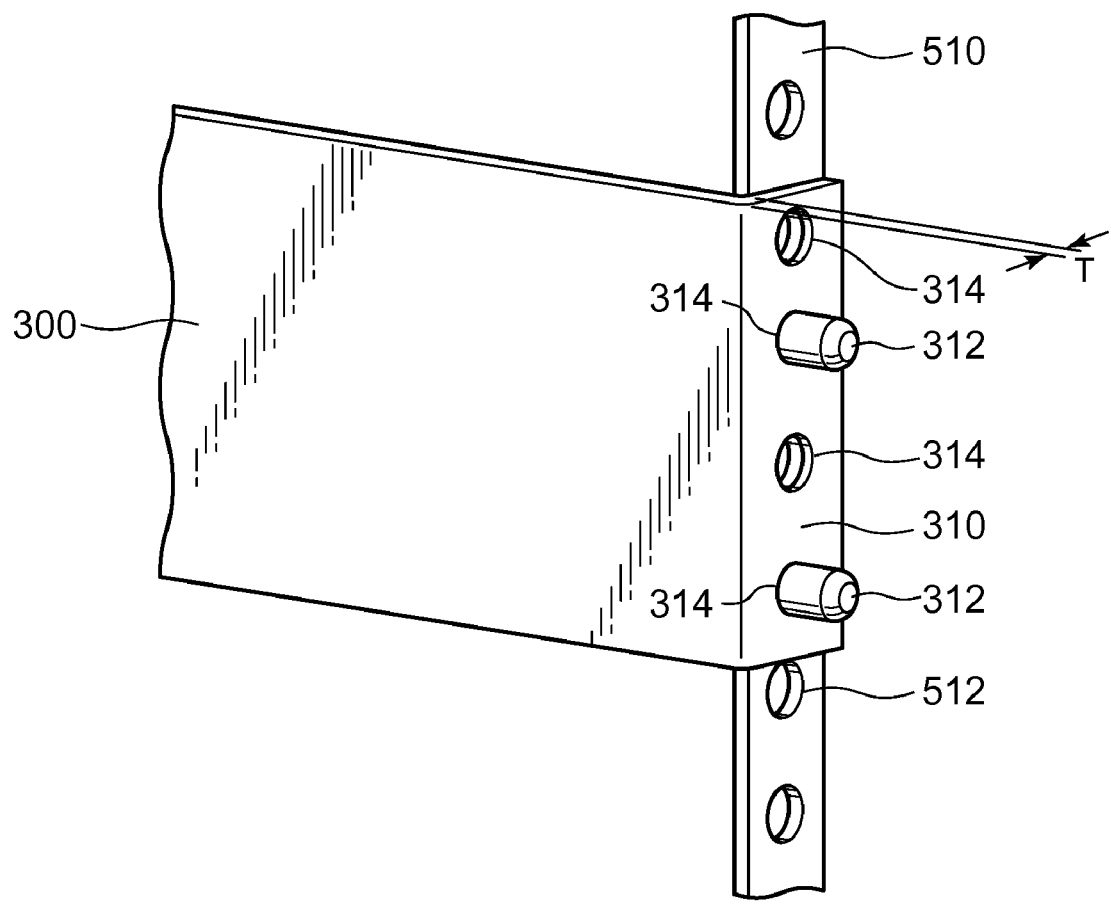
FIG. 8 is a perspective partial view of a conventional tool-less rack rail system, illustrating the attachment of the conventional tool-less rack rail system to the post.

FIG. 1 is a perspective partial view of a tool-less rack rail system 100 incorporating a clamping mechanism, according to an exemplary embodiment of the invention, which is engageable with a post 210 of a rack system. As is conventional, the rack system includes at least two front posts 210 and 230 and two rear posts 220 and 240, as shown in FIG. 6. For simplicity, only one post 210 is shown in FIG. 1. The rack rail system 100 includes a rail assembly 110 that extends between the post 210 and the corresponding rear post 220 (FIG. 6), a flange 120 provided on at least an end of the rail assembly 110, and a clamp 130 pivotably connected to the flange 120.

The rail assembly 110 may include two rail members slidably connected to each other, so as to be expandable between the front post 210 and rear post 220. An expanding spring (not shown) may be connected between the two rail members so as to facilitate the expansion of the rail assembly 110. The rail assembly 110 may also include a supporting portion 112 extending in a horizontal direction to support one side of the electronic equipment. However, the present invention may also be utilized in other applications, for example, to support an intermediate supporting member, e.g., a shelf or a drawer, for example, that supports or accommodates the electronic equipment thereon or therein.

Further, the post 210 in the exemplary illustrated embodiment is not to be interpreted as having any particular configuration or size. That is, the post 210 may be a flange-shaped post, i.e., an Electronic Industries Alliance (EIA) flange configured to EIA standards, or may be formed in various other shapes.

Figure 2:
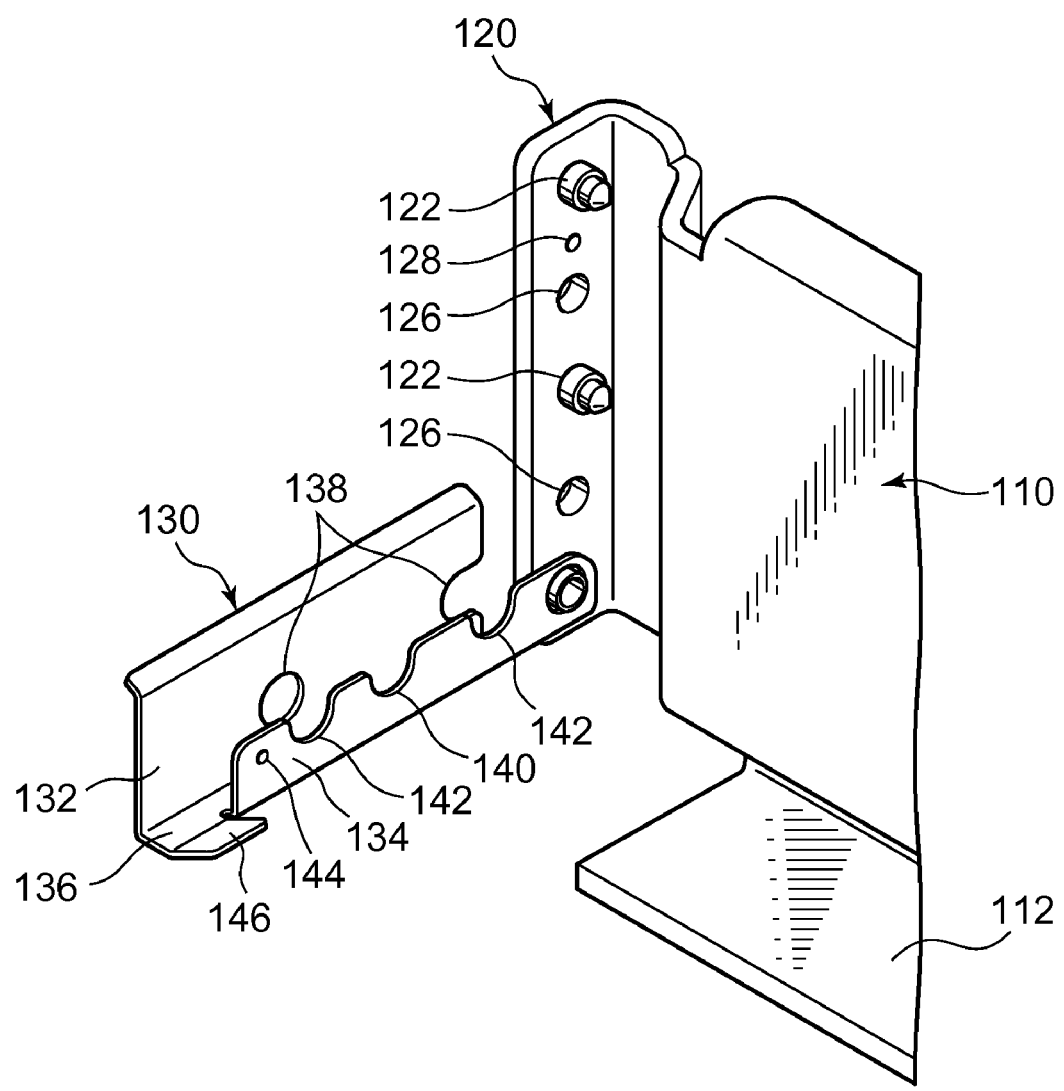
FIG. 2 is another perspective partial view of the rack rail system shown in FIG. 1, from an opposite direction to that of FIG. 1.
Figure 3:
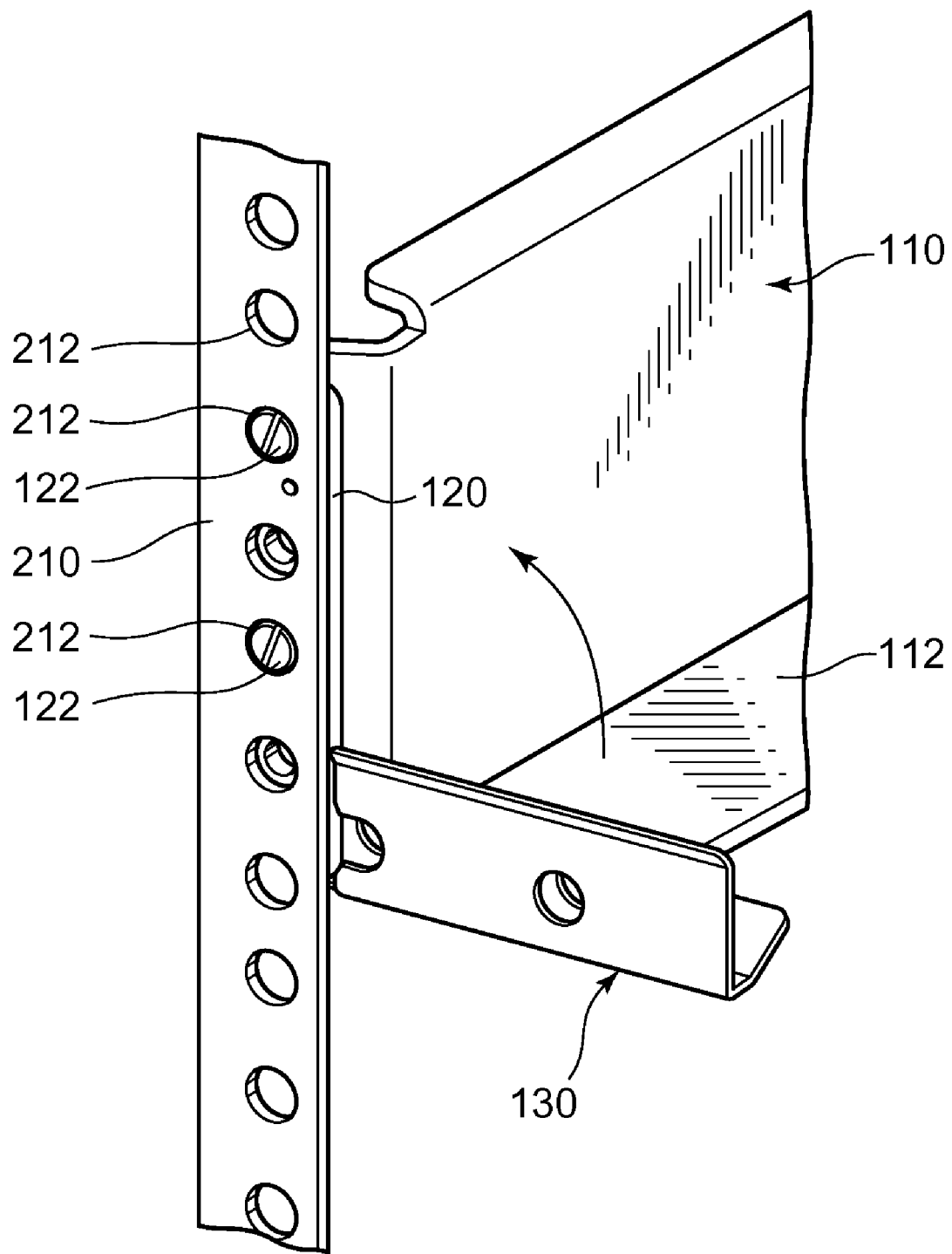
FIG. 3 is a perspective partial view of the rack rail system shown in FIG. 1, illustrating the attachment of a rack rail system to a post of a rack, with the clamp in an open position.
Figure 4:
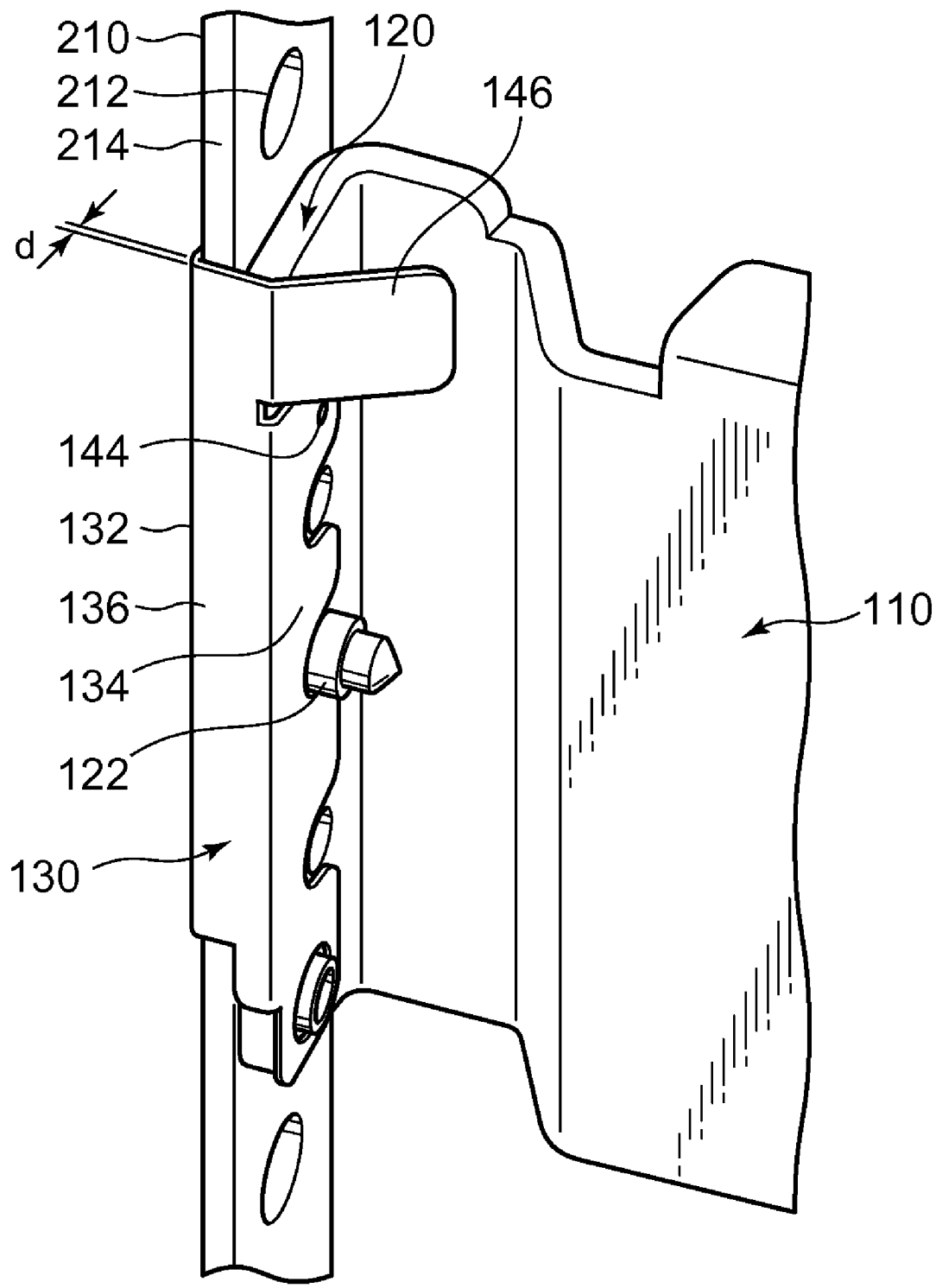
FIG. 4 is a perspective partial view of the rack rail system shown in FIG. 1, illustrating the attachment of the rack rail system to the post of the rack, with the clamp in a closed position.

The flange 120 may be provided on one or both ends of the rail assembly 110. In the exemplary illustrated embodiment, the flange 120 is provided on each end of the rail assembly 110, as shown in FIG. 6. Referring also to FIGS. 2 and 3, the flange 120 may include one or more pins 122 that are inserted in respective apertures 212 formed on the post 210 when an outer surface of the flange 120 abuts an inner surface of the post 210. An aperture 124 is formed on the flange 120 to accommodate a rivet or other fastener, that pivotably connects the clamp 130 to the flange 120. For example, the clamp 130 is riveted to the flange 120 through the aperture 124, so as to allow a pivoting movement between an open position as shown in FIG. 1 and a closed position as shown in FIG. 4. One or more extra apertures 126 may be formed on the flange 120 into which additional fastening elements may be inserted.

The clamp 130 may include three portions, i.e., a front portion 132, a rear portion 134 (shown in FIG. 2), and a middle portion 136 connecting the front and rear portions 132 and 134 together. The clamp 130 may be U-shaped in cross-section. One or more apertures 138 corresponding to the extra apertures 126 of the flange 120 may be formed on the front portion 132 of the clamp 130.

In some instances, the rail system 100 could incorporate a sliding assembly between a surface of the rail assembly 110 and the drawer it is holding (not shown). The purpose of this sliding assembly would be to allow the drawer to be slidably extended from the rack for top and bottom access of the drawer. In this case, the front portion 132 of clamp 130 could be reshaped to incorporate a catch (not shown). This catch would interface with any corresponding latch on the drawer. The purpose of this catch and latch is to retain the drawer within the rack, until the system needs to be slidably extended from the rack.

FIG. 2 is another perspective partial view of the rack rail system 100 shown in FIG. 1, from an opposite direction to that of FIG. 1. As shown, the rear portion 134 of the clamp 130 may include an aperture 140 into which the pin 122 is inserted when the clamp 130 pivots toward the flange 120. One or more extra apertures 142 may be formed on the rear portion 134 of the clamp 130, so as to correspond to both the extra apertures 126 of the flange 120, and to the apertures 138 of the front portion 132 of the clamp 130. Additional fastening elements may be inserted through the apertures 126, 138 and 142 of the rack rail system 100, so as to firmly mount the flange 120 to the post 210, as will be explained later. The apertures 126, 138, 142 and 212 may be generally circular or square through openings, U-shaped or semi-circular slots, or have other configurations.

The rear portion 134 of the clamp 130 may further include a dimple 144 protruding toward the front portion 132. The flange 120 may further include an opening or recess 128 that accommodates the dimple 144 of the clamp 130, when the clamp 130 is closed, so as to maintain the clamp 130 in the closed position. Preferably, the opening 128 may be formed either as a through hole or as a concave recess. Alternatively, a dimple may be formed on the flange 120, while an opening or recess may be formed in the rear portion 134 of the clamp 130 to accommodate the dimple on the flange 120.

The clamp 130 may further include a finger 146 to facilitate the gripping of the clamp 130 when the clamp 130 is to be detached from the flange 120. A user can easily grip the finger 130 to move the clamp 130 from the closed position to the open position. Because the finger 146 is bent outwardly from the clamp 130, the finger 146 provides a space in which a protruding portion of the pin 122 may be accommodated, as shown FIG. 5.

Figure 5:
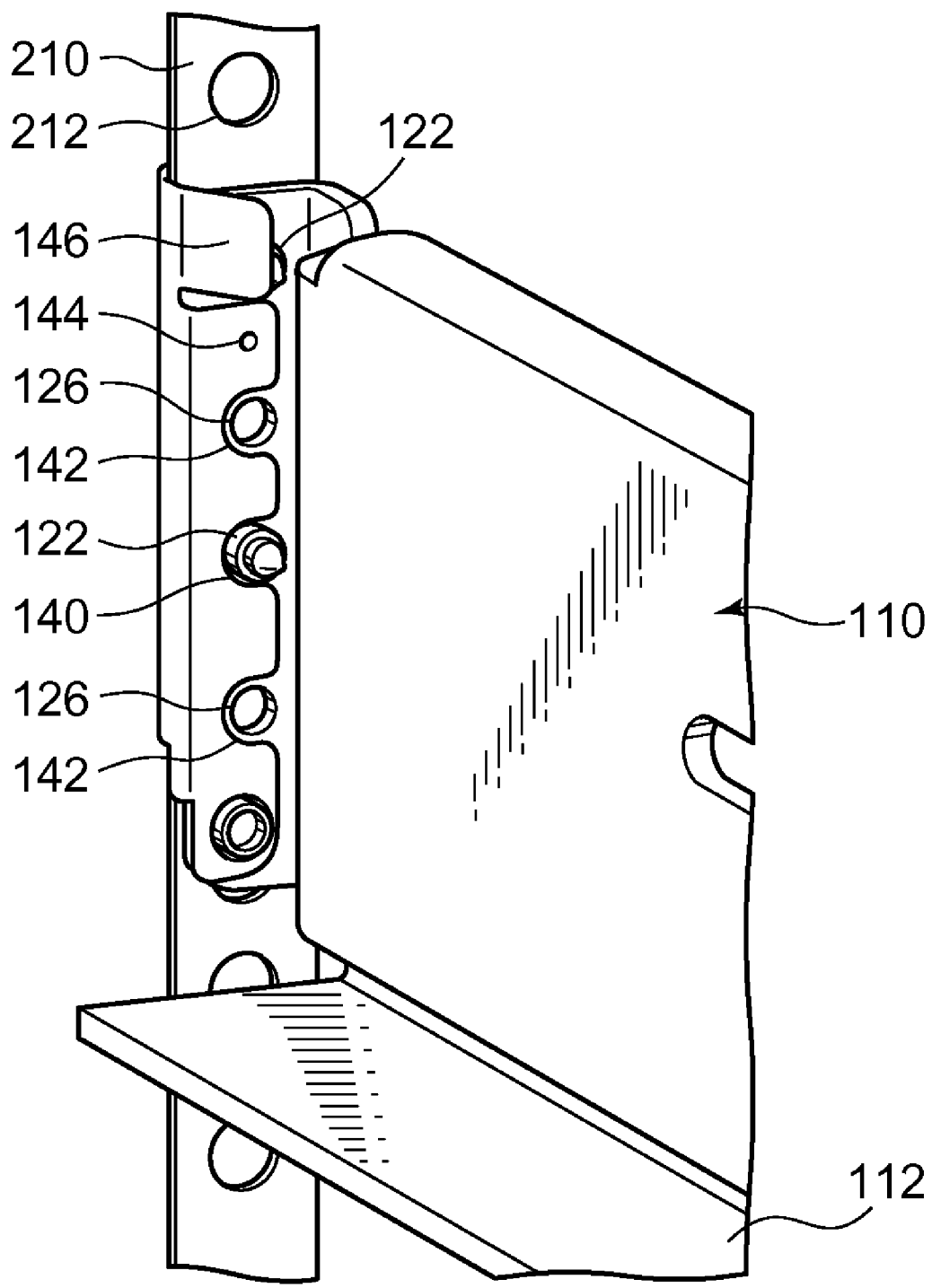
FIG. 5 is another perspective partial view of the rack rail system shown in FIG. 1, from a different direction than that of FIG. 4.

Referring to FIGS. 3-5, attachment of the rack rail system 100 to the post 210 will be explained. As shown in FIG. 3, the flange 120 of the rack rail system 100 is attached to the post 210, with the clamp 130 being in the open position. The flange 120 is attached to an inner surface of the post 210. Unlike to the conventional rack rail system, in the open position, the flange 120 neither wraps around the post 210 nor is attached to an outer surface of the post 210. The pins 122 are inserted into the apertures 212 of the post 210. Preferably, the pins 122 have a height that is selected so that they do not protrude beyond the outer surface of the post 210, so as to enable the clamp 130, when closed, to tightly cover and hold the post 210.

The weight of both the rack rail system 100 and the electronic equipment on the rack rail system 100 is supported by the post 210 through the pins 122 of the flange 120. Accordingly, the only force that needs to be resisted by the clamp 130 is a force in the horizontal direction, e.g., to prevent the pins 122 from sliding out of the apertures 212. To resist the horizontal force, the clamp 130 pivots at the aperture 124 such that it moves toward the post 210 and flange 120, along the direction indicated by an arrow shown in FIG. 3.

Referring to FIG. 4, the clamp 130 is shown located in the closed position. The front portion 132 of the clamp 130 covers the outer surface of the post 210, and the rear portion 134 of the clamp 130 covers the inner surface of the flange 120. The dimple 144 of the clamp 130 is engaged with and retained in the opening 128. The clamp 130 holds both the flange 120 and post 210 together, so as to connect the flange 120 tightly to the post 210 in the horizontal direction. Moreover, the presence of the electronic equipment, the drawer or shelf supported by the rack rail system 100 will help prevent the clamp 130 from inadvertently pivoting into the open position. That is, a sidewall of the electronic equipment, the drawer or shelf will interfere with the middle portion 136 of the clamp 130 in the case of any movement of the clamp 130 toward the open position.

When closed, the middle portion 136 of the clamp 130 covers an edge 214 of the post 210, and interferes with a space between the edge 214 of the front post 210 and an edge of the other front post 230 of the rack, as shown in FIG. 6. The rack rail system 100 may also include a further rail assembly 150 mounted between the other front post 230 and its corresponding rear post 240, with a middle portion of the associated clamp 160 covering an edge of the other front post 230. The middle portion of the clamp 160 may have the same thickness as the middle portion 136 of the clamp 130. Thus, when the middle portion 136 has a thickness of d, as shown in FIG. 4, and when the distance between the edge of the front post 210 and the edge of the other front post 230 is D, as shown in FIG. 6, the maximum allowable width of the electronic equipment between the two posts 210 and 230 is a value obtained by subtracting 2d from D.

Preferably, the thickness d of the clamp 130 is smaller than a thickness of the flange 120, so as to minimize interferences at the edge of the post 210, and thereby to maximize the allowable width between the two posts. For example, the clamp 130 may be made of a sheet metal that gives several extra millimeters of allowable width to the rack rail system 100. As another example, the clamp 130 may be made of a sheet metal with the same thickness as a conventional nut retainer clip, so that any rack system capable of accommodating the conventional nut retainer clip on its post is able to use the rack rail system 100 instead.

As shown in FIGS. 5 and 6, the aperture 138 of the clamp 130, the aperture 212 of the post 210, the aperture 126 of the flange 120 and the aperture 142 of the clamp 130 are in alignment with each other, in this given order. The apertures 138, 212, 126 and 142 collectively form a through opening into which additional fastening elements can be inserted, so as to firmly mount the flange 120 to the post 210. The additional fastening element will also simultaneously penetrate through the aperture 212 of the post 210, since the post 210 will be disposed between the aperture 126 of the flange 120 and the aperture 138 of the clamp 130.

The present invention thus provides for a tool-less rack rail system incorporating a clamping mechanism that will allow its flange to be attached to the inner surface of the post. Moreover, since the clamp has a thickness thinner than the flange, the rack rail system minimizes the space interference at the front of the post, and maximizes the allowable width of the electronic equipment or other system supported thereon. Further, due to the configuration of the clamp, the clamp, once closed, is prevented from inadvertently being separated from the post and the flange. Further, the finger of the clamp allows a user to easily disengage the clamp from the closed position, to detach the flange from the post.

Furthermore, since the pins of the rack rail system do not protrude from the apertures of the post and since the clamp covers the outer surface of post, there is no wasted space at the outer surface of the post due to any protruding pins. Accordingly, if a covering element is provided that surrounds the outer surface of the post, the covering element does not need to be customized to the rack rail system so as to prevent interference with any protruding portion of the pins.

Moreover, because the clamp and the flange may further include apertures that correspond to each other and to the aperture of the post, additional fastening elements can be inserted the through opening formed by the apertures of the rack rail system and the post.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings. It will be understood that the above description of the preferred embodiments of the present invention are susceptible to various modifications, changes, and adaptations, and the same are intended to be comprehended within the meaning and range of equivalents of the appended claims.

What is claimed is:

1. A rack rail system engageable with a post of a rack, comprising:
   a rail assembly;
   a flange provided on at least an end of the rail assembly, the flange including a pin insertable into an aperture of the post when the flange is adjacent to the post; and
   a clamp pivotably connected to the flange and movable from an open position and a closed position, the clamp having a front portion and a rear portion which face each other, the clamp receiving both the post and the flange in the closed position, such that both the post and the flange are sandwiched between the front and rear portions of the clamp in the closed position and wherein the clamp has an aperture accommodating a portion of the pin protruding from the flange when the clamp is in the closed position.

2. The rack rail system of claim 1, wherein, when the clamp is in the closed position, the front portion of the clamp will cover an outer surface of the post, and the rear portion of the clamp covers an inner surface of the flange.

3. The rack rail system of claim 1, wherein the clamp has a protruding dimple, and the flange has an opening or a concave portion to accommodate the dimple when the clamp is in the closed position.

4. The rack rail system of claim 1, wherein the flange has a protruding dimple, and the clamp has an opening or a concave portion to accommodate the dimple when the clamp is in the closed position.

5. The rack rail system of claim 1, wherein the clamp has an outwardly bent finger.

6. The rack rail system of claim 1, wherein a portion of the clamp disposed on an edge of the post when the clamp is in the closed position, has a thickness smaller than a thickness of the flange.

7. The rack rail system of claim 1, wherein the clamp has a thickness smaller than a thickness of the flange.

8. The rack rail system of claim 1, wherein the clamp is made of a sheet metal.

9. The rack rail system of claim 1, wherein the clamp further includes a middle portion, and wherein when the clamp is in the closed position, the front portion covers an outer surface of the post, the rear portion covers an inner surface of the flange, and the middle portion covers an edge of the post.

10. The rack rail system of claim 1, wherein the flange has an aperture that is disposed in alignment with another aperture on the post when the clamp is in the closed position to accommodate a fastening element therein.

11. The rack rail system of claim 10, wherein the clamp has an aperture that is disposed in alignment with the aperture of the flange when the clamp is in the closed position, so as to accommodate the fastening element.

12. The rack rail system of claim 1, wherein the pin has a height that is less than or equal to a thickness of the flange and the post, so that the pin, after being inserted into the aperture, does not protrude beyond an outer surface of the post.

13. The rack rail system of claim 1, wherein the rail assembly includes two rail members slidably connected to each other.

14. A system comprising:
    electronic equipment;
    a rack for accommodating the electronic equipment, the rack including at least four spaced, generally vertical posts, each post including a plurality of mounting apertures; and
    a rack rail system engageable with the rack, the rack rail system including:
      a first and a second rail slidably connected to each other;
      a flange provided on an end of each rail;
      at least one pin fixed to and protruding from each respective flange, the pin being configured to be inserted into a respective mounting aperture of the post when the flange is disposed adjacent to the post; and
      a clamp pivotably connected to the flange and movable from an open position and a closed position, the clamp having a front portion and a rear portion which face each other, the clamp receiving both the flange and the post adjacent to flange when the flange is in the closed position, such that both the flange and the adjacent post are sandwiched between the front and rear portions of the clamp in the closed position.

15. The rack rail system of claim 14, wherein the clamp has a protruding dimple, and the flange has an opening or a concave portion to accommodate the dimple when the clamp is in the closed position.

16. The rack rail system of claim 14, wherein the clamp has an outwardly bent finger.

17. The rack rail system of claim 14, wherein the clamp has an aperture accommodating a portion of the pin protruding from the flange when the clamp is in the closed position.

18. The rack rail system of claim 14, wherein the clamp further includes a middle portion, and wherein when the clamp is in the closed position, the front portion covers an outer surface of the post, the rear portion covers an inner surface of the flange, and the middle portion covers an edge of the post.

* * * * *